(12) United States Patent
Miyazaki et al.

(10) Patent No.: US 9,070,482 B2
(45) Date of Patent: Jun. 30, 2015

(54) MULTI-CHIP PACKAGE SEMICONDUCTOR MEMORY DEVICE

(75) Inventors: Satoshi Miyazaki, Tokyo (JP); Hidekazu Nasu, Miyazaki (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 512 days.

(21) Appl. No.: 13/159,517

(22) Filed: Jun. 14, 2011

(65) Prior Publication Data

US 2011/0314234 A1 Dec. 22, 2011

(30) Foreign Application Priority Data

Jun. 17, 2010 (JP) ................................. 2010-138312

(51) Int. Cl.
G06F 12/00 (2006.01)
G06F 13/00 (2006.01)
G06F 13/28 (2006.01)
G11C 29/00 (2006.01)

(52) U.S. Cl.
CPC ................ *G11C 29/70* (2013.01); *G11C 29/76* (2013.01)

(58) Field of Classification Search
CPC ................................ G11C 29/70; G11C 29/76
USPC ......................................... 711/154, E12.001
See application file for complete search history.

(56) References Cited

U.S. PATENT DOCUMENTS

| 4,228,496 | A | * | 10/1980 | Katzman et al. ............... 710/100 |
| RE37,184 | E | * | 5/2001 | Kushiyama et al. ............ 365/201 |
| 6,373,758 | B1 | * | 4/2002 | Hughes et al. .................. 365/200 |
| 6,438,045 | B1 | * | 8/2002 | King et al. ...................... 365/200 |
| 6,757,842 | B2 | * | 6/2004 | Harari et al. .................. 714/6.32 |
| 2003/0126525 | A1 | * | 7/2003 | Miyashita et al. ............. 714/718 |
| 2004/0034825 | A1 | * | 2/2004 | Jeddeloh ......................... 714/733 |
| 2005/0144516 | A1 | * | 6/2005 | Gonzalez et al. ................. 714/8 |

(Continued)

FOREIGN PATENT DOCUMENTS

JP 11-249969 9/1999
JP 2001-265665 A 9/2001

(Continued)

OTHER PUBLICATIONS

Notice of Rejection dated Nov. 12, 2013.

(Continued)

*Primary Examiner* — Sheng-Jen Tsai
(74) *Attorney, Agent, or Firm* — Volentine & Whitt, PLLC

(57) ABSTRACT

An MCP type semiconductor memory device having a defective cell remedy function, enables easy design and manufacture while minimizing chip area increase. The semiconductor memory device includes memory chips and a memory controller chip that designates an address of a memory chip according to an access request received from outside and controls access to the designated address. Each memory chip includes first and second storage regions and an information holder that holds address information representing associations between addresses in the first and second storage regions. The memory controller chip includes an address translating part that performs, upon receiving a request to access a specific address in the first storage region indicated by the address information, address designation by translating the specific address in the first storage region to an address in the second storage region corresponding to the specific address based on the associations represented by the address information.

5 Claims, 7 Drawing Sheets

(56) References Cited

U.S. PATENT DOCUMENTS

| | | | |
|---|---|---|---|
| 2005/0283657 A1* | 12/2005 | Nishihara | 714/8 |
| 2006/0158951 A1* | 7/2006 | Kim | 365/225.7 |
| 2007/0103978 A1* | 5/2007 | Conley et al. | 365/185.09 |
| 2008/0191990 A1* | 8/2008 | Matsubara et al. | 345/98 |
| 2008/0270675 A1* | 10/2008 | Nagaraj et al. | 711/100 |
| 2009/0013148 A1 | 1/2009 | Eggleston | |
| 2009/0147600 A1* | 6/2009 | Martin et al. | 365/200 |
| 2009/0282301 A1* | 11/2009 | Flynn et al. | 714/710 |
| 2011/0309525 A1* | 12/2011 | Nasu et al. | 257/777 |
| 2012/0159281 A1* | 6/2012 | Shalvi et al. | 714/755 |
| 2012/0176851 A1* | 7/2012 | Lunde et al. | 365/200 |
| 2014/0192583 A1* | 7/2014 | Rajan et al. | 365/63 |
| 2014/0195726 A1* | 7/2014 | Lee | 711/103 |

FOREIGN PATENT DOCUMENTS

| | | |
|---|---|---|
| JP | 2002-133894 A | 5/2002 |
| JP | 2005-135183 | 5/2005 |
| JP | 2005-209184 A | 8/2005 |
| JP | 2007-094765 A | 4/2007 |
| JP | 2008-117299 A | 5/2008 |

OTHER PUBLICATIONS

Japanese Office Action dated Jan. 20, 2015.

* cited by examiner

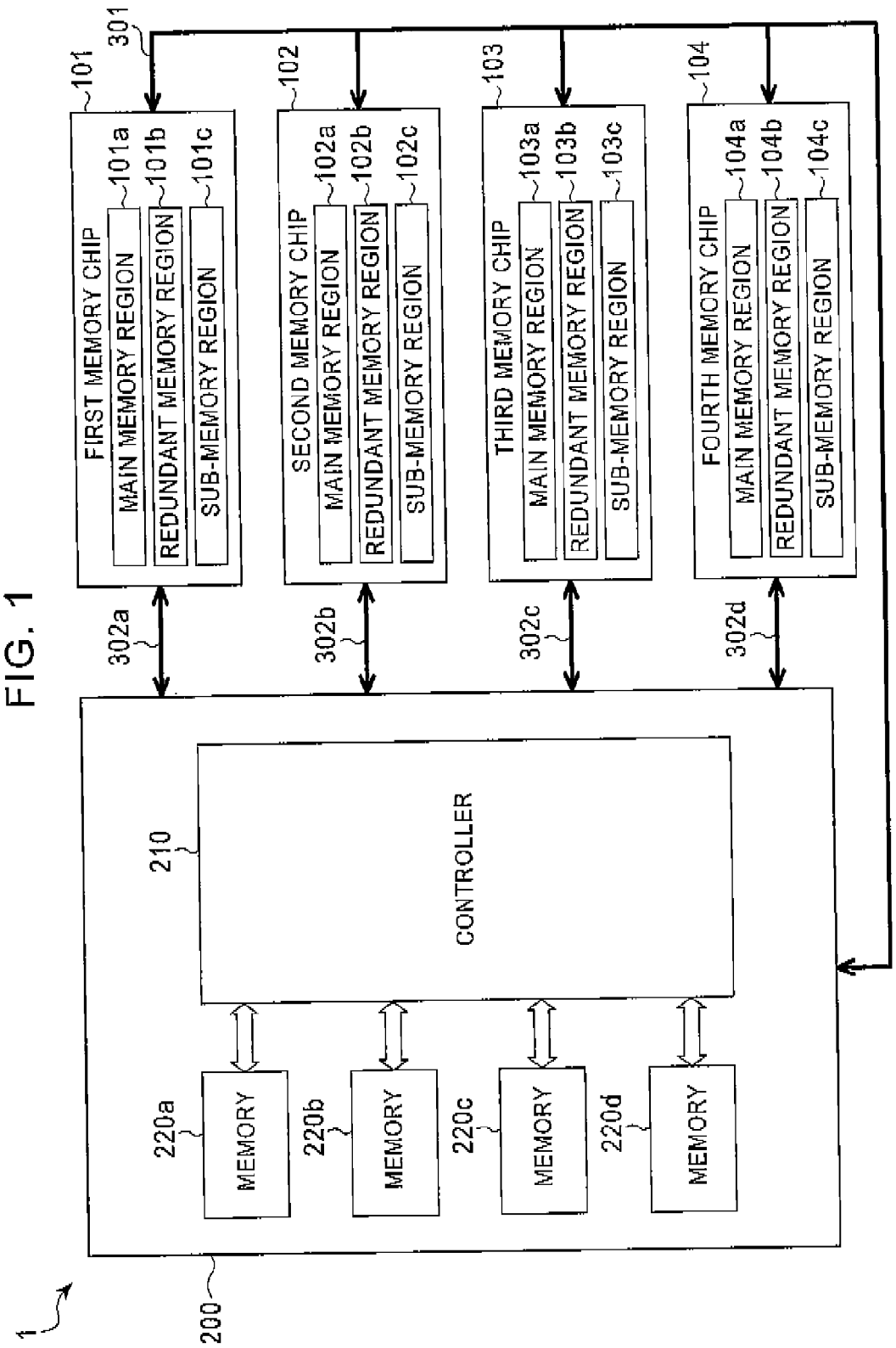

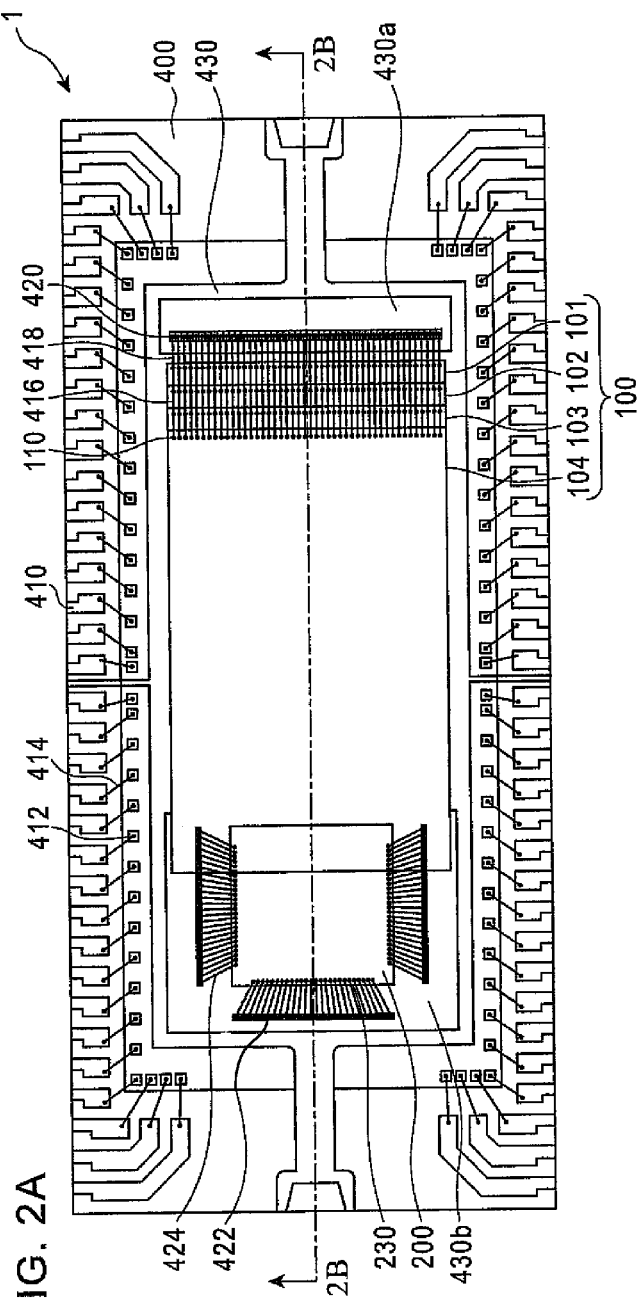
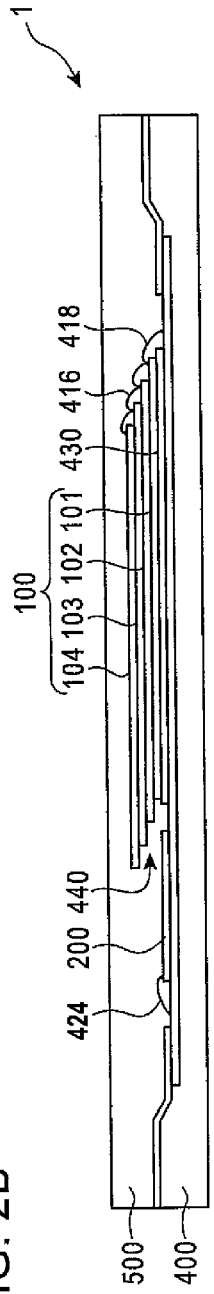
FIG. 2A
FIG. 2B

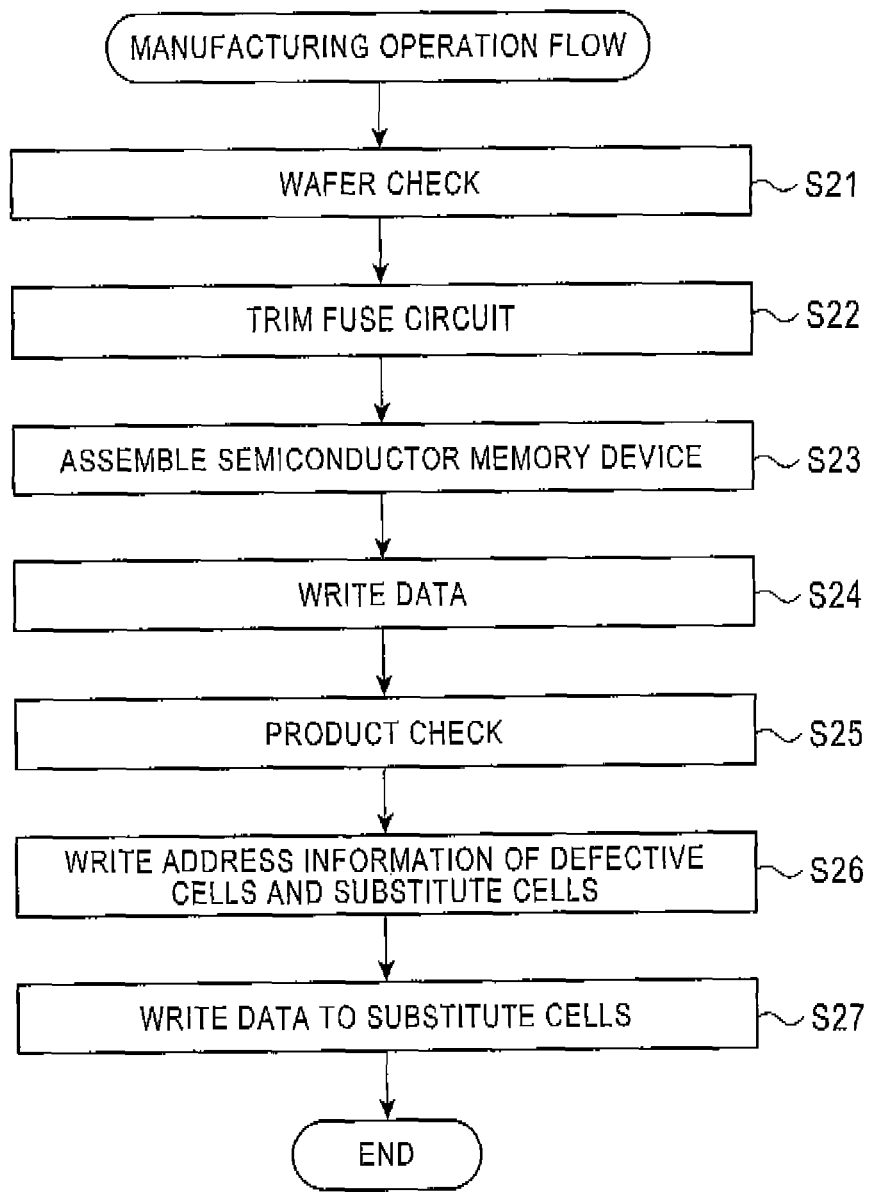

MULTI-CHIP PACKAGE SEMICONDUCTOR MEMORY DEVICE

BACKGROUND OF THE INVENTION

1. Field of the Invention

The present invention relates to a semiconductor memory device, and more particularly to a Multi-Chip Package (MCP) type semiconductor memory device including a plurality of memory chips and one memory controller chip which are provided in one package.

2. Description of the Related Art

In the field of mobile devices such as mobile phones, advanced functions, such as functions to store and reproduce still images, moving images, and music, and a game function, have been increasingly adopted and there has also been a great demand for high speed processing of a large amount of data. Thus, there is a need to increase storage capacity while achieving a reduction in the size of the semiconductor memory. MCP, which incorporates a plurality of memory chips into one package, is a package technology developed to meet such a need. Particularly, a stack MCP including a stack of two or more chips is effective in reducing package size.

If one defective cell is present in a memory chip provided in the MCP type semiconductor memory, the entire semiconductor memory becomes defective even when other memory chips are not defective, causing great loss. To remedy defective cells present in each memory chip, the MCP type semiconductor memory is provided with a reserve storage region (including redundant cells) separately from a conventional storage region so as to replace detective cells with redundant cells. A fuse circuit is generally used as a means for replacing defective cells with redundant cells.

Meanwhile, Japanese Patent Kokai No. 2005-135183 (Patent Literature 1) describes an MCP type memory system including one nonvolatile memory LSI and a plurality of volatile memories LSI. The nonvolatile memory LSI of this memory system includes a command issuance circuit that issues a command to perform defect remedy (or defect compensation) of the volatile memory LSI. The volatile memory LSI includes a decoder circuit that decodes a command sent from the command issuance circuit and a volatile defect information holding circuit that holds defect remedy information. Defect remedy of the volatile memory LSI is performed based on the defect remedy information held by the defect information holding circuit.

For the memory system described in the patent Literature 1 described above, it is necessary to design two types of memory chips, the nonvolatile memory LSI and the volatile memory LSI, requiring a significant development time. Even when memory elements are constructed of, for example, only nonvolatile memories, there is a need to provide a memory chip including a circuit for generating a command to perform defect remedy and a memory chip including a circuit for decoding the command. That is, in this case, it is also necessary to design two types of memory chips for a single product and it is difficult to reduce the number of development processes and manufacturing costs. Another solution may be considered in which both a command generator and a command decoder are formed in one memory chip and one of the generator and decoder functions is selected upon packaging. However, this is undesirable since an unused function remains in the chip, causing an increase in chip area.

SUMMARY OF THE INVENTION

Therefore, the present invention has been made in view of the above circumstances, and it is an object of the present invention to provide an MCP type semiconductor memory device including a plurality of memory chips and having a defective cell remedy function, which enables easy design and manufacture while minimizing an increase in chip area.

In accordance with one aspect of the present invention, the above and other objects can be accomplished by the provision of a semiconductor memory device including a plurality of memory chips and a memory controller chip that designates an address of a memory chip according to an access request received from outside and controls access to the designated address, wherein each of the memory chips includes first and second storage regions and an information holder that holds address information representing an association between a specific address in the first storage region and an address in the second storage region, and the memory controller chip includes an address translating part that performs, upon receiving a request to access the specific address in the first storage region indicated by the address information, address designation by translating the specific address in the first storage region to an address in the second storage region corresponding to the specific address based on the association represented by the address information.

In accordance with another aspect of the present invention, there is provided a method for manufacturing the semiconductor memory device, the method including an assembly process for packaging the memory chips and the memory controller chip, a write process for writing predetermined data to the first storage region, a check process for checking whether or not data written to the first storage region is correct, an information holding process for storing an association between an address of a defective cell in the first storage region, which has been determined to be defective in the check process, and an address of an arbitrary memory cell in the second storage region as the address information in the information holder, and a rewriting process for writing data corresponding to the address of the defective cell to a memory cell corresponding to an address of the second storage region corresponding to the address of the defective cell, the address of the second storage region being designated by the address information.

The semiconductor memory device according to the present invention enables easy memory chip design and manufacture while minimizing an increase in chip area.

BRIEF DESCRIPTION OF THE DRAWINGS

The above and other objects, features and other advantages of the present invention will be more clearly understood from the following detailed description taken in conjunction with the accompanying drawings, in which:

FIG. 1 is a block diagram illustrating a configuration of a semiconductor memory device 1 according to an embodiment of the present invention;

FIG. 2A is a plan view illustrating a configuration of a package of a semiconductor memory device according to an embodiment of the present invention and FIG. 2B is a cross-sectional view taken along line 2b-2b of FIG. 2A;

FIG. 7 is a flow chart illustrating a method for manufacturing a semiconductor memory device according to another embodiment of the present invention.

DETAILED DESCRIPTION OF THE INVENTION

Figure 3:
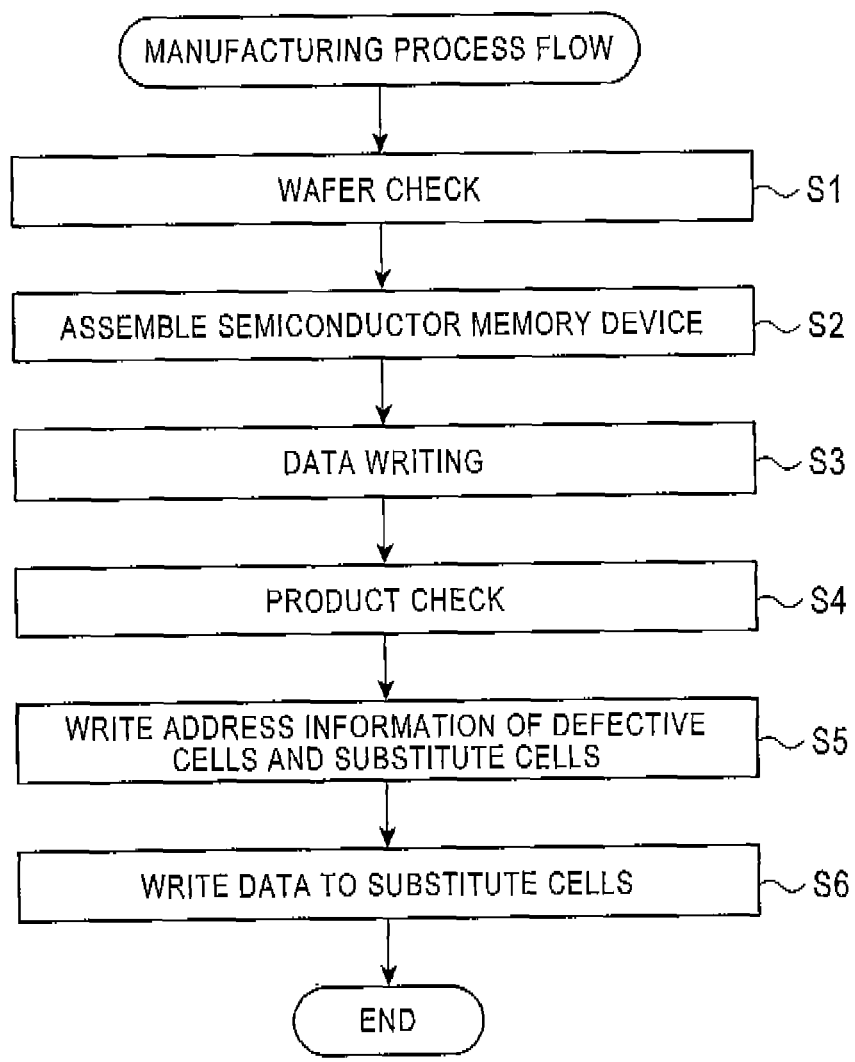
FIG. 3 is a flow chart illustrating a method for manufacturing a semiconductor memory device according to an embodiment of the present invention.

Embodiments of the present invention will now be described with reference to the drawings. In the following drawings, substantially the same or equivalent elements or parts are denoted by the same reference numerals.

[Embodiment 1]

FIG. 1 is a block diagram illustrating a configuration of a semiconductor memory device 1 according to Embodiment 1 of the present invention. The semiconductor memory device 1 is an MCP type semiconductor memory device, for example, including tour memory chips 101 to 104 and a single memory controller chip 200 that are incorporated in a package.

Each of the memory chips 101 to 104 has the same circuit configuration and includes a nonvolatile storage region having a form such as, for example, a mask ROM, a Programmable ROM (PROM), an Erasable Programmable ROM (EPROM), an Electrically Erasable and Programmable ROM (EEPROM), and a flash memory. The nonvolatile storage region includes, for example, MOS-structured memory cells having floating gates. The storage regions of the memory chips 101 to 104 include main memory regions 101a to 104a, redundant memory regions 101b to 104b, and sub-memory regions 101c to 104c, respectively.

Each of the main memory regions (first storage regions) 101a to 104a is a storage region that has a relatively large storage capacity and stores user data such as, for example, a computer program, text data, video data, and image data. Each of the redundant memory regions (second storage regions) 101b to 104b is an auxiliary storage region that stores, when defective cells are present in a corresponding one of the main memory regions 101a to 104a, data that otherwise would have been stored in the defective cells. Each of the sub-memory regions (information holders) 101c to 104c is a storage region that holds an address of a defective cell in a corresponding one of the main memory regions 101a to 104a and an address of a memory cell to substitute for the defective cell (hereinafter referred to as a "substitute cell") in a corresponding one of the redundant memory regions 101b to 104b in association with each other. The storage capacity of each of the redundant memory regions 101b to 104b and the sub-memory regions 101c to 104c may be smaller than the storage capacity of each of the main memory regions 101a to 104a. Each of the memory chips 101 to 104 includes peripheral circuits (not shown) such as a row decoder, a column decoder, an address buffer, a sense amplifier, input and output buffers in addition to the storage regions described above.

The memory controller chip 200 comprises an arithmetic circuit and the like and includes a controller 210 that specifies addresses of the memory chips 101 to 104 according to an access request from an external host device and controls writing and/or reading of data to and from the memory chips 101 to 104 at the specified addresses. The memory controller chip 200 also includes volatile memories (table holders) 220a to 220d. The memories 220a to 220d store address translation tables generated by the controller 210. The address translation tables represent associations between addresses of defective cells in the main memory regions 101a to 104a in the memory chips 101 to 104 and addresses of memory cells (substitute cells) in the redundant memory regions 101b to 104b to substitute for the defective cells.

The memories 220a to 220d are provided respectively in association with the memory chips 101 to 104. That is, an address translation table associated with the first memory chip 101 is stored in the memory 220a, an address translation table associated with the second memory chip 102 is stored in the memory 220b, an address translation table associated with the third memory chip 103 is stored in the memory 220c, and an address translation table associated with the fourth memory chip 104 is stored in the memory 220d.

The address translation tables are generated by the controller 210 based on address information stored in the sub-memory regions 101c to 104c of the memory chips 101 to 104. When the controller 210 has received a request to access defective cells in the main memory regions 101a to 104a from an external host device, the controller 210 converts address designations for specifying the defective cells into address designations for specifying substitute cells in the redundant memory regions 101b to 104b based on the address translation tables. This allows data to be written to or read from the substitute cells in the redundant memory regions in place of the defective cells in the main memory regions.

Transmission and reception of various signals and data between the memory controller chip 200 and the memory chips 101 to 104 is performed through a common bus 301 and dedicated buses 302a to 302d. The common bus 301 includes address lines for specifying addresses of access destinations of the memory chips 101 to 104, data lines for transferring data read from the memory chips 101 to 104 or data to be stored in the memory chips 101 to 104, control lines for transferring control signals from the memory controller chip 200 to the memory chips 101 to 104, and the like. The memory chips 101 to 104 share the common bus 301 and various signals and data are transmitted through the common bus 301, for example, using a time division multiplexing scheme.

The dedicated buses 302a to 302d are address lines for transferring address designations for specifying substitute cells in the redundant memory regions 101b to 104b. The dedicated buses 302a to 302d are provided respectively for the memory chips 101 to 104. That is, the dedicated bus 302a is used exclusively by the first memory chip 101, the dedicated bus 302b is used exclusively by the second memory chip 102, the dedicated bus 302c is used exclusively by the third memory chip 103, and the dedicated bus 302d is used exclusively by the fourth memory chip 104.

FIG. 2A is a plan view illustrating a configuration of a package of the semiconductor memory device 1 and FIG. 2B is a cross-sectional view taken along line 2b-2b of FIG. 2A. A wiring substrate 400 is formed of, for example, an insulating material such as glass epoxy resin or ceramics and conductive wires are formed on a chip mounting surface of the wiring substrate 400. A plurality of lead electrodes 410 is formed on the chip mounting surface of the wiring substrate 400 along longitudinal sides of the wiring substrate 400 and a plurality of bonding pads 412 is provided near the lead electrodes 410 in association with the lead electrodes 410, respectively. Each of the bonding pads 412 is electrically connected to a corresponding lead electrode 410 through a bonding wire 414.

The memory chips 101 to 104 have the same circuit configuration, the same chip structure, and the same external dimensions. The external appearance of each of the memory chips 101 to 104 has a rectangular shape and a plurality of bonding pads 110 is provided along one short side of each of the memory chips. Bonding pads are not provided at a side of each memory chip facing the memory controller chip 200 (i.e., at a side thereof adjacent to a mounting position of the memory controller chip 200).

The memory chips 101 to 104 are provided on the wiring substrate 400 such that the memory chips 101 to 104 are stacked in the depth direction. The stack of the memory chips 101 to 104 is referred to as a "stacked memory chip". The first memory chip 101 is bonded to the chip mounting surface of the wiring substrate 400 through a die pad 430 having a specific thickness. The second memory chip 102 is bonded to the first memory chip 101 through an adhesive. The third memory chip 103 is bonded to the second memory chip 102 through an adhesive. The fourth memory chip 104 is bonded to the third memory chip 103 through an adhesive. An upper memory chip is stacked on an immediately lower memory chip such that the upper memory chip shifts relative to the lower memory chip in a direction toward the mounting position of the memory controller chip 200 while aligning long sides of the upper memory chip with long sides of the lower memory chip. That is, the upper memory chip is stacked on the immediately lower memory chip so as to shift along the long sides of the memory chips such that the bonding pads 110 of the immediately lower memory chip are exposed. Accordingly, in the case where the bonding pads 110 of the immediately lower memory chip are located at the right side, the upper memory chip is mounted at a position to which the upper memory chip is slid to the left side of the immediately lower memory chip. Here, the bonding pads 110 of the upper memory chip are also located at the right side such that the bonding pads 110 of the upper memory chip are close to the corresponding bonding pads of the immediately lower memory chip. The bonding pads of the upper memory chip are connected to the corresponding bonding pads of the immediately lower memory chip through bonding wires 416. The bonding pads of the first memory chip 101, which is the lowest memory chip, are connected to corresponding bonding pads 420 on the wiring substrate 400 through bonding wires 418. An opening 430*a* is formed in the die pad 430 and the bonding pads 420 on the wiring substrate 400 are exposed through the opening 430*a*.

The memory controller chip 200 is mounted on the wiring substrate 400 adjacent to the stacked memory chip 100. The memory controller chip 200 is in the form of, for example, a rectangle having sides shorter than the short sides of the memory chips 101 to 104. Bonding pads 230 are provided on the chip mounting surface of the memory controller chip 200 along three sides of the chip mounting surface, excluding one side adjacent to the mounting position of the stacked memory chip 100. That is, bonding pads are not provided near a side adjacent to both the memory chips 101 to 104 and the memory controller chip 200. The die pad 430 has an opening 430*b* and the memory controller chip 200 is directly bonded to a part of the wiring substrate 400, which is exposed through the opening 430*b*, using a bonding material such as an adhesive. Thus, a vertical position of the mounting surface (i.e., the bottom surface) of the memory controller chip 200 is lower than a vertical position of the mounting surface (i.e., the bottom surface) of the stacked memory chip 100 mounted on the die pad 430.

The stacked memory chip 100 is stacked so as to protrude in a direction toward the mounting position of the memory controller chip 200 and a space 440 is formed between the protruding part of the stacked memory chip 100 and the wiring substrate 400. A part of the memory controller chip 200, including the side facing the stacked memory chip on which bonding pads are not formed, is received in the space 440. That is, the protruding part of the stacked memory chip 100 and the memory controller chip 200 partially overlap in plan view. In this embodiment, the fourth memory chip 104, which is the top memory chip, and the third memory chip 103, which is immediately below the fourth memory chip 104, overlap with the memory controller chip 200.

The bonding pads 230 of the memory controller chip 200 are electrically connected to bonding pads 422 on the wiring substrate 400 through bonding wires 424. The height of the space 440 is adjusted such that bonding wires connected to bonding pads provided on the part of the memory controller chip 200 received in the space 440 are not in contact with the memory chips within the space 440. Specifically, the thicknesses of the memory chips and the die pad 430, the loop height of the bonding wires 424, and the like are adjusted such that the vertical position of the bottom surface of the third memory chip 103 that partially overlaps with the memory controller chip 200 is sufficiently higher than the vertical position of loop tops of the bonding wires 424.

The memory chips 101 to 104 and the memory controller chip 200 are electrically connected through conductive wires provided on the wiring substrate 400 and bonding wires to form the common bus 301 and the dedicated buses 302*a* to 302*d* that are described later. Transmission and reception of control, signals and data between the memory controller chip 200 and an external device is performed through the lead electrodes 410. The memory chips 101 to 104, the memory controller chip 200, and the bonding wires 414, 416, 418, and 424 are embedded in a sealing resin 500.

Such a package configuration of the semiconductor memory device 1 achieves a reduction in the package size while reducing the thickness of the package. Namely, in the configuration in which the memory controller chip is additionally stacked on the stacked memory chip, it is difficult to meet the demand for thinness since the package becomes too thick. On the other hand, simply juxtaposing the stacked memory chip and the memory controller chip may fail to sufficiently cope with the demand for further reduction in package size. The semiconductor memory device 1 according to this embodiment employs a configuration in which the stacked memory chip 100 and the memory controller chip 200 are juxtaposed on the substrate to reduce the thickness of the package. In addition, since bonding pads are not provided on adjacent sides of the memory controller chip and the memory chips, the two chips can be mounted close to each other, thereby reducing package size. Further, since the stacked memory chip 100 is mounted via the die pad 430 while each memory chip is stacked so as to shift toward the mounting position of the memory controller chip 200, the height of the space below the protruding part of the stacked memory chip 100 is increased, limitation in the loop height of the bonding wires 424 is alleviated, and it is possible to further reduce the distance between the stacked memory chip 100 and the memory controller chip 200, thereby enabling further reduction in package size.

A method for manufacturing the semiconductor memory device 1 having the above configuration will now be described with reference to a manufacturing process flow shown in FIG. 3.

First, an electricity check is performed on wafers of memory chips and a memory controller chip. Most memory chips including defective cells are rejected through this check process (step S1).

Then, the semiconductor memory device 1 is assembled. A known MCP type semiconductor package manufacturing procedure may be used to assemble the semiconductor memory device 1. Specifically, wafers of memory chips and a memory controller chip are ground to a specific thickness from a rear surface. Then, the wafers are diced into memory chips and a memory controller chip. Then, the memory controller chip 200 is bonded to the chip mounting surface of the wiring substrate 400 using an adhesive. Then, bonding pads 230 of the memory controller chip 200 are wire-bonded to bonding pads 422 of the wiring substrate 400 through bonding wires 424. Then, a die pad 430 is bonded to the chip mounting surface of the wiring substrate 400 using an adhesive and memory chips 101 to 104 are then stacked on the die pad 430. Here, the memory chips may be bonded to each other, for example, using a resin adhesive. Then, bonding pads 110 of the memory chips are wire-bonded through bonding wires 416 and bonding pads 110 of the lowest memory chip 101 are wire-bonded to bonding pads 420 on the wiring substrate 400 through bonding wires 418. In addition, bonding pads 412 and lead electrodes 410 are wire-bonded through bonding wires 414. Then, the memory chips 101 to 104, the memory controller chip 200, and the bonding wires 414, 416, 418, and 424 are sealed through a sealing resin 500. Assembly of the semiconductor memory device 1 is completed through the above processes (step S2).

Then, desired data is written to main memory regions 101a to 104a of the memory chips 101 to 104. The written data may be user data such as, for example, a computer program, text data, image data, and video data (step S3). This step may be omitted depending on the usage or the purpose of use of the semiconductor memory device 1. In this case, data writing is performed in a subsequent process or is performed by the user.

Then, the semiconductor memory device 1 to which data has been written is checked. In this check process, the data written in the previous step S3 is read and whether or not the read data is correct is determined. New defects of memory cells that have occurred through the assembly process, defects of memory cells that have been confirmed by reading user data, and the like are detected in this check process (step S4). Addresses of defective cells in the main memory regions 101a to 104a detected in this check process are stored in the tester.

Then, the addresses of the defective cells in the main memory regions 101a to 104a detected in the check process of the previous step S4 are stored in the sub-memory regions 101c to 104c in association with addresses of memory cells (substitute cells) in the redundant memory regions 101b to 104b to substitute for the defective cells. Allocation of addresses of memory cells for use as substitute cells is performed, for example, by selecting such addresses from empty addresses in the redundant memory regions in order of increasing addresses. Such address allocation or writing of address information of defective cells or substitute cells to the sub-memory regions is implemented by a function of the tester used in the check process of the above step S4 (step S5). The address information written to the sub-memory regions 101c to 104c is provided to the memory controller chip 200 to generate the address translation tables.

Then, data corresponding to defective cells in the main memory regions 101a to 104a detected in step S4 is written to substitute cells of the redundant memory regions 101b to 104b that correspond to the addresses allocated in step S5 (step S6). A writer that writes data to the redundant memory regions 101b to 104b in this step holds address information of defective cells and substitute cells used for writing to the sub-memory regions 101c to 104c in the previous step S5. The semiconductor memory device 1 is completed by writing desired data to the main memory regions 101a to 104a and the redundant memory regions 101b to 104b and writing address information of the defective cells and the substitute cells to the sub-memory regions 101c to 104c in the above manner. The order of step S6 and step S5 may be switched. That is, the address information of the defective cells and the substitute cells may be written to the sub-memory regions 101c to 104c after data corresponding to the defective cells of the main memory regions 101a to 104a detected in step S4 is written to the substitute cells. In this case, there is an advantage in that it is also possible to cope with the case where substitute cells are defective.

Figure 4:
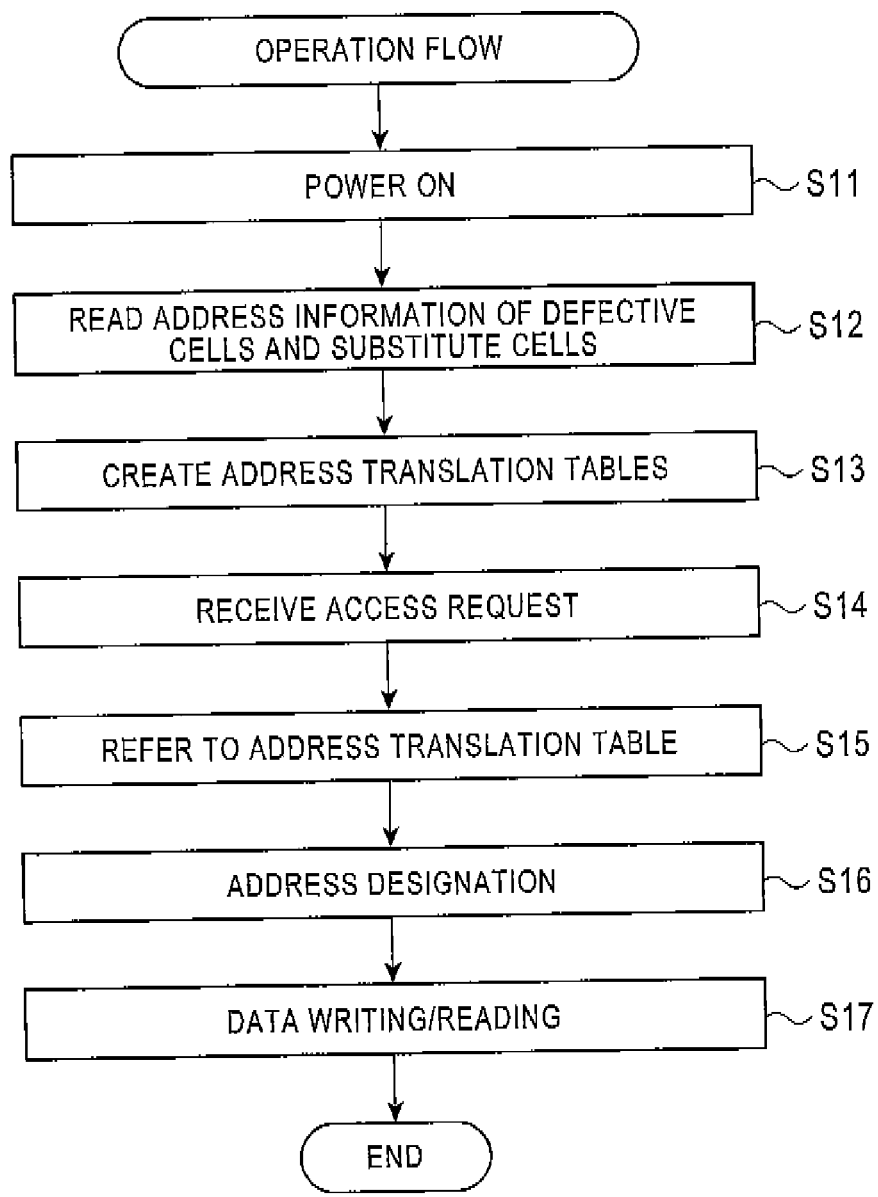
FIG. 4 is a flow chart illustrating operation of a semiconductor memory device according to an embodiment of the present invention.
Figure 5:
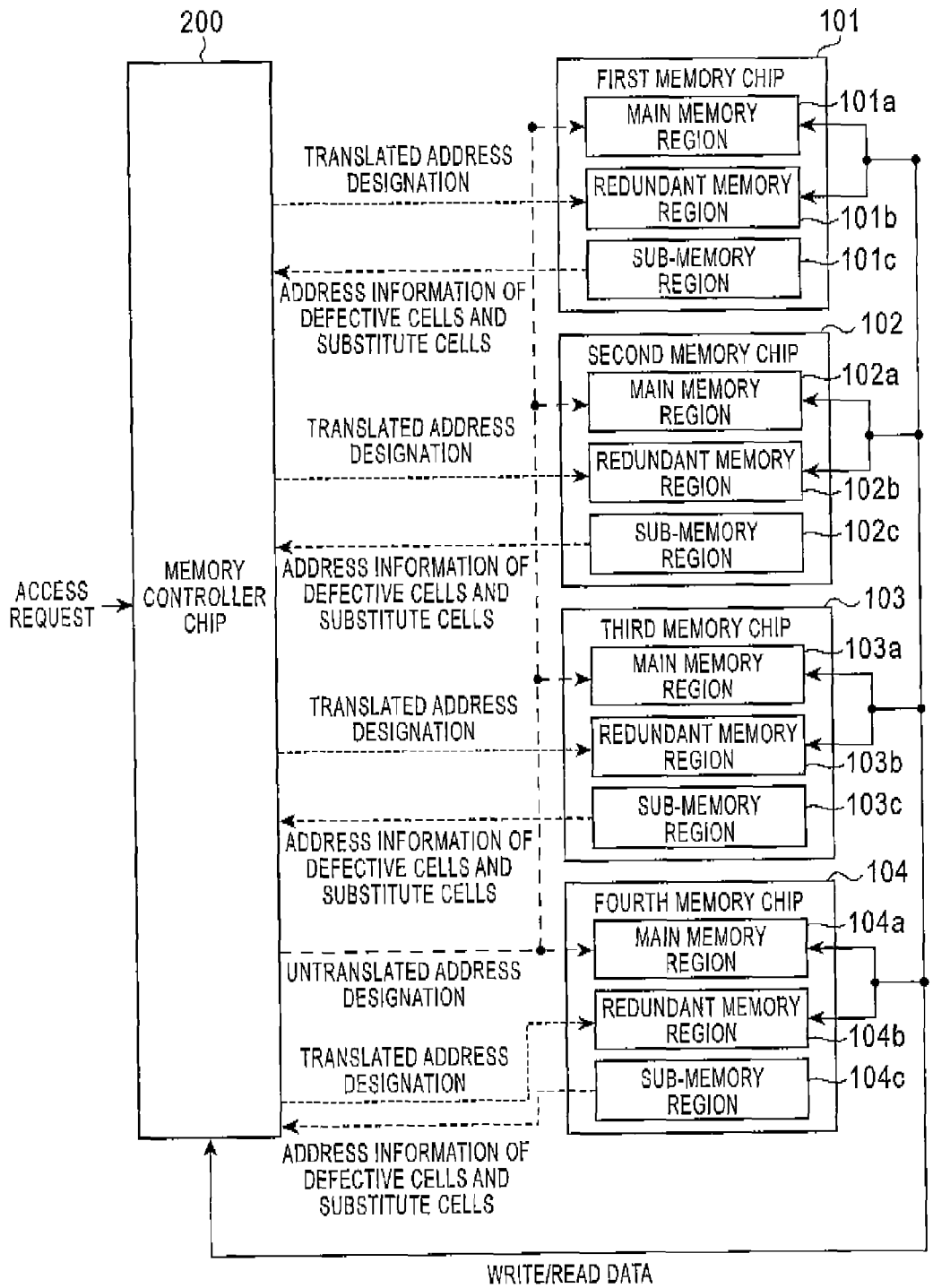
FIG. 5 is a block diagram illustrating flow of signals or data of a semiconductor memory device according to an embodiment of the present invention.

Operation of the semiconductor memory device 1 will now be described. FIG. 4 is a flow chart illustrating operation of the semiconductor memory device 1 and FIG. 5 is a block diagram illustrating flow of signals or data of the semiconductor memory device 1. In the following description, it is assumed that defective cells are present at first and third addresses of the main memory region 101a of the first memory chip 101, data to be written to these addresses is written to first and second addresses of the redundant memory region 101b, and address information of the defective cells and the substitute cells is written to the sub-memory region 101c. In addition, it is assumed that a defective cell is present at a third address of the main memory region 102a of the second memory chip 102, data to be written to the address is written to a first address of the redundant memory region 102b, and address information of the defective cell and the substitute cell is written to the sub-memory region 102c. It is also assumed that no defective cells are present in the third and fourth memory chips 103 and 104 and data has been correctly written to the main memory regions 103a and 104a.

When the semiconductor memory device 1 is powered on (step S11), the controller 210 of the memory controller chip 200 accesses the sub-memory regions 101c to 104c of the memory chips (step S12) and generates respective address translation tables of the memory chips based on address information representing associations between defective cells and substitute cells stored in the sub-memory regions and stores the generated address translation tables in the corresponding memories 220a to 220d in the memory controller chip 200 (step S13).

The controller 210 in the memory controller chip 200 receives a request to access the memory chips 101 to 104 from an external host device (step S14).

When the external host device has issued the request to access the memory chips 101 to 104, the controller 210 refers to the address translation tables stored in the memories 220a to 220d (step S15). Here, it is assumed that the access request received from the host device has been made to access the first addresses of the main memory regions 101a to 104a of the memory chips. The address translation table of the first memory chip 101 stored in the memory 220a indicates that the first address of the main memory region 101a is to be replaced with the first address of the redundant memory region 101b. The controller 210 translates an address designation that specifies the first address of the main memory region 101a to an address designation that specifies the first address of the redundant memory region 101b based on such information stored in the address translation table. The translated address designation is provided to the memory chip 101 through the dedicated bus 302a (step S16).

Since the address translation tables of the second to fourth memory chips 102 to 104 do not indicate replacement addresses of the first addresses of the main memory regions 102a to 104a, the controller 210 specifies the first addresses of the main memory regions 102a to 104a for the second to fourth memory chips 102 to 104 without converting the address designations for the second to fourth memory chips 102 to 104. These address designations are provided to the memory chips 102 to 104 through the common bus 301 (step S16). Although the untranslated address designation is provided to the memory chip 101 through the common bus 301, the translated address designation provided through the dedicated bus 302a is preferentially applied to the memory chip 101.

Next, a description is given of the case where the external host device has issued a request to access the third addresses of the main memory regions 101a to 104a of the memory chips. The controller 210 refers to the address translation tables stored in the memories 220a to 220d (step S15). The address translation table of the first memory chip 101 stored in the memory 220a indicates that the third address of the main memory region 101a is to be replaced with the second address of the redundant memory region 101b. In addition, the address translation table of the second memory chip 102 stored in the memory 220a indicates that the third address of the main memory region 102a is to be replaced with the first address of the redundant memory region 102b. For the first memory chip 101, the controller 210 converts an address designation that designates the third address of the main memory region 101a to an address designation that designates the second address of the redundant memory region 101b based on such information stored in the address translation table. For the second memory chip 102, the controller 210 converts an address designation that designates the third address of the main memory region 102a to an address designation that designates the first address of the redundant memory region 102b based on such information stored in the address translation table. The translated address designations are provided to the memory chips 101 and 102 through the dedicated buses 302a and 302b (step S16).

Since the address translation tables of the third and fourth memory chips 103 and 104 do not indicate replacement addresses of the first addresses of the main memory regions 103a and 104a, the controller 210 specifies the third addresses of the main memory regions 103a and 104a for the third and fourth memory chips 103 and 104 without translating the address designations for the third and fourth memory chips 103 and 104. These address designations are provided to the memory chips 103 and 104 through the common bus 301 (step S16)

The memory chips 101 to 104 decode the address designations received through the common bus 301 or the dedicated buses 302a to 302d using a column decoder (not shown) and a row decoder (not shown). Then, for example, when the access request is a read request, each of the memory chips 101 to 104 reads data from the specified address and provides the read data to the memory controller chip 200 through the common bus 301. The memory controller chip 200 provides the read data to the external host device (step S17).

As can be understood from the above description, since the semiconductor memory device 1 according to the embodiment of the present invention remedies defective cells detected in product check performed after specific data is written to the semiconductor memory device 1 after assembly, it is possible to minimize loss of the semiconductor memory device. In addition, functional units for remedying defective cells, i.e., the memories 220a to 220d for storing address translation tables and the controller 210 for performing address translation, are incorporated into the memory controller chip 200 and the memory chips 101 to 104 do not include functional units for remedying defective cells other than storage regions. Thus, it is possible to reduce the number of development processes and manufacturing costs since the memory chips can be designed so as to have the same configuration and each memory chip does not include any used functional unit. That is, since the semiconductor memory device 1 is constructed using the common memory chips, it is easy to design and manufacture the semiconductor memory device 1 and it is also possible to increase storage capacity per unit area of each memory chip. Further, since address designations for the redundant memory regions 101b to 104b are separated from address designations for the main memory regions 101a to 104a and are transmitted through the dedicated buses 302a to 302d, it is possible to reduce the number of address digits and therefore it is possible to reduce the number of wires, thereby achieving a reduction in chip area.

In addition, although address information of defective cells and substitute cells of each memory chip is held in a sub-memory region of the memory chip in the above embodiment, address information of one memory chip may be held, for example, in a sub-memory region of another memory chip.

[Embodiment 2]

Figure 6:
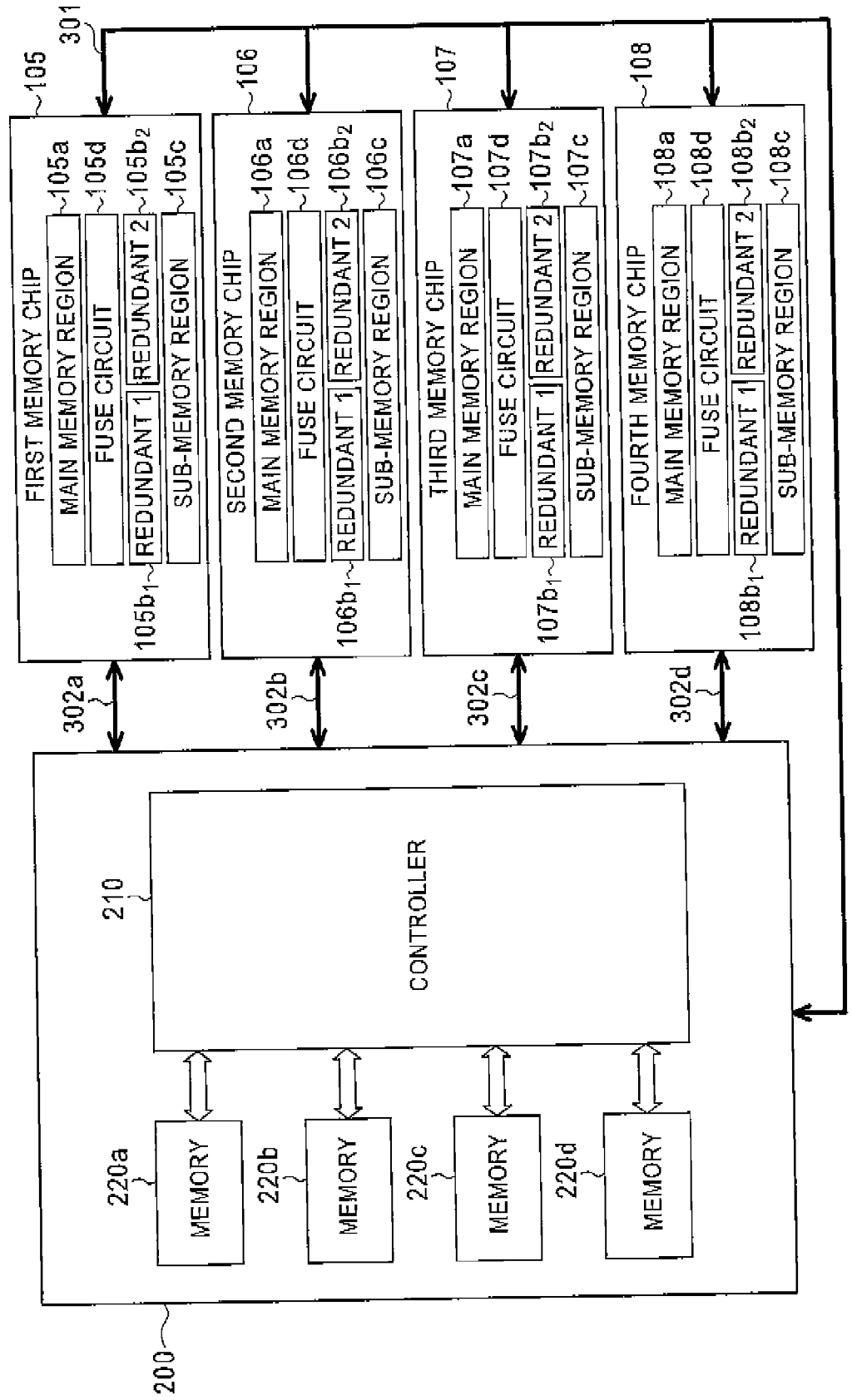
FIG. 6 is a block diagram illustrating a configuration of a semiconductor memory device according to another embodiment of the present invention.

A semiconductor memory device according to Embodiment 2 of the present invention is described below. FIG. 6 is a block diagram illustrating a configuration of a semiconductor memory device 2 according to Embodiment 2 of the present invention. Similar to Embodiment 1, the semiconductor memory device 2 is an MCP type semiconductor memory device including a plurality of memory chips 105 to 108 and one memory controller chip 200 that are incorporated in a package. Internal configurations of the memory chips of the semiconductor memory device 2 are different from those of Embodiment 1. The memory chips 105 to 108 include fuse circuits 105d to 108d, which are generally used as means for remedying defective cells, in addition to main memory regions 105a to 108a, first redundant memory regions $105b_1$ to $108b_1$, second redundant memory regions $105b_2$ to $108b_2$, and sub-memory regions 105c to 108c, respectively. Each of the fuse circuits 105d to 108d includes a plurality of fuse elements configured such that, according to states of electrical connections formed by cutting the fuse elements, access to a specific memory cell in the main memory regions 105a to 108a is translated to access to a specific memory cell in the second redundant memory regions $105b_2$ to $108b_2$ without performing the above address translation process by the memory controller chip 200. Access destination conversion through the fuse circuits 105d to 106d may be performed, for example, on a word line basis or on a bit line basis.

The second redundant memory regions $105b_2$ to $108b_2$ are storage regions having memory cells, with which memory cells in the main memory regions 105a to 108a are to be replaced through the fuse circuits 105d to 108d. On the other hand, similar to Embodiment 1, the first redundant memory regions $105b_1$ to $108b_1$ are storage regions having memory cells, with which memory cells in the main memory regions 105a to 108a are to be replaced through the address translation process by the memory controller chip 200, and associations between the first redundant memory regions $105b_1$ to $108b_1$ and the main memory regions 105a to 108a are specified based on address information stored in the sub-memory regions 105c to 108c.

The configuration of the semiconductor memory device 2 is similar to the configuration of the semiconductor memory device 1 according to Embodiment 1, except that the memory chips additionally include the fuse circuits 105d to 108d and the associated second redundant memory regions $105b_2$ to $108b_2$, respectively.

A method for manufacturing the semiconductor memory device 2 having the above configuration will now be described with reference to a manufacturing process flow shown in FIG. 7.

First, an electricity check is performed on wafers of memory chips and a memory controller chip (step S21).

Then, when it has been detected in the electricity check of step S21 that defective cells are present in the main memory regions 105a to 108a, the fuse circuits 105d to 108d are trimmed so as to replace the defective cells with memory cells in the second redundant memory regions $105b_2$ to $108b_2$. The fuse circuits 105d to 108d are trimmed, for example, by cutting fuse elements through laser beams (step S22).

Then, the semiconductor memory device 2 is assembled. A known MCP type semiconductor package manufacturing procedure may be used to assemble the semiconductor memory device 1. Details of the manufacturing procedure are similar to those of Embodiment 1 described above (step S23).

Then, desired data is written to main memory regions 105a to 108a of the memory chips. The written data may be user data such as, for example, a computer program, text data, image data, and video data. Through trimming of the fuse circuit in step S22, data corresponding to defective cells detected in step S21 is directly written to memory cells in the second redundant memory regions $105b_2$ to $108b_2$ (step S24). This step may be omitted depending on the usage or the purpose of use of the semiconductor memory device. In this case, data writing is performed in a subsequent process or is performed by the user.

Then, the semiconductor memory device 2 to which data has been written is checked. In this check process, the data written in the previous step S24 is read and whether or not the read data is correct is determined. New defects of memory cells that have occurred through the assembly process, defects of memory cells that have been confirmed by reading user data, and the like are detected in this check process (step S25). Addresses of defective cells in the main memory regions 105a to 108a detected in this check process are stored in the tester.

Then, the addresses of the defective cells in the main memory regions 105a to 108a detected in the check process of the previous step S25 are stored in the sub-memory regions 105c to 108c in association with addresses of substitute cells in the first redundant memory regions $105b_1$ to $108b_1$. Allocation of addresses of memory cells for use as substitute cells is performed, for example, by selecting such addresses from empty addresses in the redundant memory regions in order of increasing addresses. Such address allocation or writing of address information of defective cells or substitute cells to the sub-memory regions is implemented by a function of the tester used in the check process of the above step S25 (step S26).

Then, data corresponding to defective cells in the main memory regions 105a to 108a detected in the step S25 is written to substitute cells of the first redundant memory regions $105b_1$ to $108b_1$ that correspond to the addresses allocated in step S26 (step S27). A writer that writes data to the first redundant memory regions $105b_1$ to $108b_1$ in this step holds address information of defective cells and substitute cells used for writing to the sub-memory regions 105c to 108c in the previous step S26. The semiconductor memory device 2 is completed by writing data to the main memory regions 105a to 108a and the first and second redundant memory regions $105b_1$ to $108b_1$ and $105b_2$ to $108b_2$ and writing address information of the defective cells and the substitute cells to the sub-memory regions 105c to 108c in the above manner. The order of step S26 and step S27 may be switched. That is, the address information of the defective cells and the substitute cells may be written to the sub-memory regions 105c to 108c after data corresponding to the defective cells of the main memory regions 105a to 108a detected in step S25 is written to the substitute cells. In this case, there is an advantage in that it is also possible to cope with the case where substitute cells are defective.

Although access to defective cells in the main memory regions 105a to 108a is replaced with access to memory cells in the second redundant memory regions $105b_2$ to $108b_2$ by hardware through the fuse circuits 105d to 108d in the semiconductor memory device 2 according to Embodiment 2, access to defective cells in the main memory regions 105a to 108a may be replaced with access to memory cells in the first redundant memory regions $105b_1$ to $108b_1$ by software through the memory controller chip 200. The address translation procedure performed by the memory controller chip 200 is similar to that of the semiconductor memory device 1 according to Embodiment 1.

Since apparent defective cells detected through wafer check of the memory chips are replaced in advance through the fuse circuits 105d to 108d, it is possible to significantly reduce data write time in the above steps S26 and S27.

This application is based on Japanese Patent Application No. 2010-138312 which is herein incorporated by reference.

What is claimed is:

1. A semiconductor memory device comprising:
   a plurality of memory chips;
   a memory controller chip that designates an address of one of said memory chips according to an access request received from outside and controls access to the designated address;
   a common bus configured to transmit signals between the memory controller chip and the memory chips; and
   dedicated buses separated from said common bus and provided for each of the memory chips and configured to transmit signals between said memory controller chip and said memory chips,
   wherein each of the memory chips includes first and second storage regions, and an information holder that holds address information representing an association between a specific address corresponding to a defective cell in the first storage region and an address in the second storage region, and
   the memory controller chip includes an address translating part that performs, upon receiving a request to access the specific address in the first storage region indicated by the address information, address designation by translating the specific address in the first storage region to an address in the second storage region corresponding to the specific address based on the association represented by the address information,
   wherein said address information represents an association between an address of a defective cell in the first storage region and an address of a memory cell in the second storage region,
   the memory controller chip includes a table holder that holds a table including said address information,
   the address translating part performs address translation based on said address information included in the table,
   wherein said memory controller chip includes a plurality of table holders which are provided respectively in association with said plurality of memory chips, and the address information in each of the plurality of table holders represents an association between an address of a defective cell in the first storage region and an address of a memory cell in the second storage region in each of the plurality of memory chips, and
   wherein said memory control chip designates a translated address in the second storage region via the dedicated bus in accordance with a request to access the address of the defective cell in the first storage region, and designates a requested address in the first storage region via the common bus in accordance with a request to access the address of the non-defective cell in the first storage region.

2. The semiconductor memory device according to claim 1, wherein each of the first and second storage regions and the information holder includes a nonvolatile memory.

3. The semiconductor memory device according to claim 1, wherein each of the memory chips further includes a fuse circuit including fuse elements, and the fuse circuit is configured such that access to a specific memory cell in the first storage region is translated to access to a memory cell in the second storage region according to states of electrical connections formed by cutting the fuse elements.

4. A method for manufacturing the semiconductor memory device according to claim 1, the method comprising:

an assembly process for packaging the memory chips and the memory controller chip;

a write process for writing predetermined data to the first storage region;

a check process for checking whether or not data written to the first storage region is correct;

an information holding process for storing an association between an address of a defective cell in the first storage region, which has been determined to be defective in the check process, and an address of an arbitrary memory cell in the second storage region as the address information in the information holder; and a rewriting process for writing data corresponding to the address of the defective cell to a memory cell corresponding to an address of the second storage region corresponding to the address of the defective cell, the address of the second storage region being specified by the address information.

5. A method for manufacturing the semiconductor memory device according to claim 3, the method comprising:

a chip check process for checking memory cells of the memory chips;

an assembly process for packaging the memory chips and the memory controller chip;

a trimming process for trimming the fuse circuit to replace a memory cell in the first storage region, which has been determined to be defective in the chip check process, with a memory cell in the second storage region;

a write process for writing predetermined data to the first storage region;

a product check process for checking whether or not data written to the first storage region is correct;

an information holding process for storing an association between an address of a defective cell in the first storage region, which has been determined to be defective in the product check process, and an address of an arbitrary memory cell in the second storage region as the address information in the information holder; and a rewriting process for writing data corresponding to the address of the defective cell to a memory cell corresponding to an address of the second storage region corresponding to the address of the defective cell, the address of the second storage region being specified by the address information.

\* \* \* \* \*